United States Patent [19]

Chu et al.

[11] Patent Number: 4,775,550

[45] Date of Patent: Oct. 4, 1988

[54] SURFACE PLANARIZATION METHOD FOR VLSI TECHNOLOGY

[75] Inventors: John K. Chu; Sanjiv K. Mittal, both of Fremont; John T. Orton, Pleasanton; Jagir S. Multani, Fremont; Robert Jecmen, Pleasanton, all of Calif.

[73] Assignee: Intel Corporation, Santa Clara, Calif.

[21] Appl. No.: 870,234

[22] Filed: Jun. 3, 1986

[51] Int. Cl.$^4$ ............................ B05D 3/06; B05D 5/12
[52] U.S. Cl. .................................... 427/38; 156/646; 156/653; 427/96; 427/99; 427/255; 427/255.3; 437/228; 437/231; 437/235; 437/245
[58] Field of Search ............... 427/38, 82, 88, 87, 427/89, 86, 93, 94, 95, 96, 99, 344, 255, 255.3, 240; 156/646, 653, 657, 662; 430/314, 317; 437/228, 231, 235, 245

[56] References Cited

U.S. PATENT DOCUMENTS

| | | | |
|---|---|---|---|
| 3,375,418 | 3/1968 | Garnache et al. | 427/93 |
| 3,413,157 | 11/1968 | Kuiper | 427/93 |
| 3,620,837 | 11/1971 | Leff et al. | 427/93 |
| 4,282,647 | 8/1981 | Richman | 427/93 |
| 4,363,868 | 12/1982 | Takasaki et al. | 427/93 |
| 4,378,410 | 3/1983 | Bailey | 427/93 |
| 4,492,717 | 1/1985 | Pliskin et al. | 427/93 |
| 4,506,435 | 3/1985 | Pliskin et al. | 427/93 |
| 4,510,678 | 4/1985 | Eggers | 427/93 |
| 4,534,826 | 8/1985 | Goth et al. | 427/93 |
| 4,566,940 | 1/1986 | Itsumi et al. | 427/93 |
| 4,587,138 | 5/1986 | Yau et al. | 427/93 |
| 4,620,986 | 11/1986 | Yau et al. | 427/93 |
| 4,636,281 | 1/1987 | Buiguez et al. | 427/93 |

OTHER PUBLICATIONS

Elkins et al., "A Planarization Process For Double Metal CMOS Using Spin-On-Glass As A Sacrificial Layer", V-MIC Conference IEEE, pp. 100–106, Jun. 9–10, 1986.

*Primary Examiner*—Sadie Childs
*Attorney, Agent, or Firm*—Blakely, Sokoloff, Taylor & Zafman

[57] ABSTRACT

A planarization process for a double metal very large scale integration (VLSI) technology is disclosed. To compensate for an irregular surface topology encountered in a dielectric medium between the two metals, a CVD dielectric layer and a glass layer are first deposited above the first metal. Then an etch-back process is used to uniformly etch back the CVD dielectric and the glass layers at the same rate, leaving a planarized surface for subsequent deposition of a second dielectric layer and a second metal layer.

27 Claims, 6 Drawing Sheets

SURFACE PLANARIZATION METHOD FOR VLSI TECHNOLOGY

BACKGROUND OF THE INVENTION

1. Field of the Invention

This invention relates to improved methods for forming multiple conductive layers on a semiconductor body by providing planarization between conductive layers.

2. Prior Art

In manufacturing multiple conductive layer semiconductor devices, such as a double-metal integrated circuit chip utilizing VLSI technology, a dielectric layer must be deposited between the conductive layers to provide insulation for the conductive layers. Prior art methods have implemented the use of a variety of materials and thicknesses of such materials as dielectric medium between the conductive layers. The topology was not of serious consequence until recently when packaging reached high-density proportions.

A major problem associated with multiple conductive layer depositions was the requirement for a smooth topology for the deposition of a subsequent conductive layer. That is, the dielectric layer needed to fill in the gaps and voids present on the surface of the semiconductor body after the first conductive layer had been patterned and etched so to provide a smooth surface whereupon the subsequent conductive layer could be deposited. As packaging density increased, prior art methods could no longer provide the planarization necessary for consistent reliability. The present invention is directed to the alleviation of defects by providing a planarization process heretofore never been attempted.

SUMMARY OF THE INVENTION

The present invention describes a process for forming multiple layers on a semiconductor body. A conductive layer is first deposited on the semiconductor body and then the conductive layer is patterned and etched. Next a first oxide layer is deposited over the conductive layer followed by a glass layer to fill in the trenches and voids left by the patterning of the conductive layer. Then the first oxide layer and the glass layer are both etched-back approximately the same rate so that the glass layer fills in the trenches and voids but leaving only the first oxide layer above the raised portions of the patterned conductive layer. By having the glass layer in the trenches and voids, a fairly smooth surface topology is achieved when a subsequent second oxide layer is deposited over the first oxide and glass layers. Then, vias may be etched through the second oxide layer allowing for a second conductive layer to make contact with the first conductive layer. Finally, a second conductive layer is deposited and patterned to form a multiple conductive layer device.

DETAILED DESCRIPTION OF THE PRESENT INVENTION

An invention is described which inhibits defects in the formation of multiple conductive layers of a semiconductor body by providing planarization between the conductive layers. In the following description, numerous specific details are set forth such as specific thicknesses, etc., in order to provide a thorough understanding of the present invention. It will be obvious, however, to one skilled in the art that the present invention may be practiced without these specific details. In other instances, well-known processes have not been described in detail in order not to unnecessarily obscure the present invention.

PRIOR ART

Figures 1, 2:
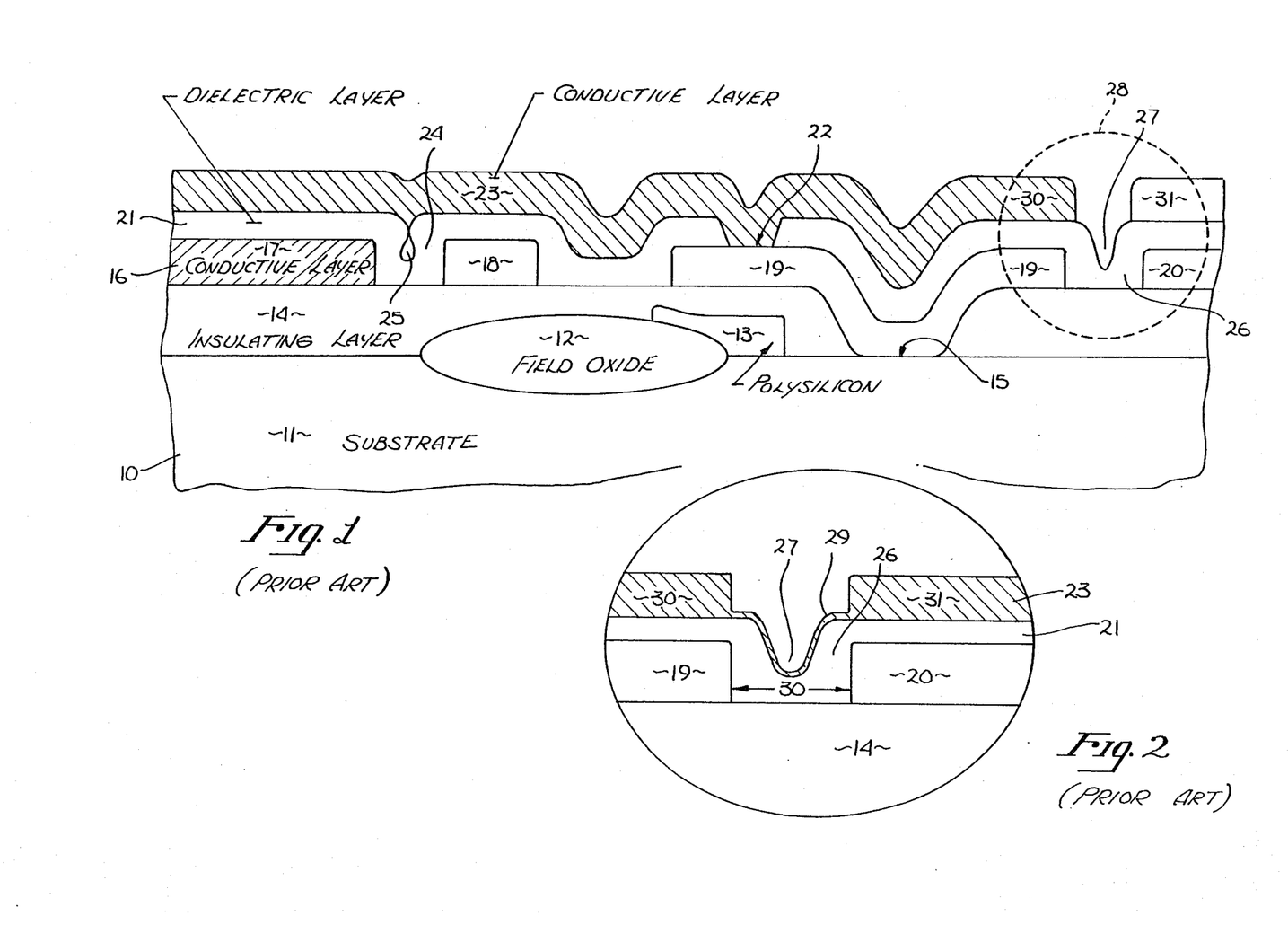
FIG. 1 is a cross-sectional elevation view of a prior art semiconductor body showing a multiple conductive layer device.
FIG. 2 is an expanded view of a portion of FIG. 1 showing a formation of a "forbidden gap".

FIG. 1 illustrates a typical prior art semiconductor device 10 having a field oxide region 12 on substrate 11. A polysilicon region 13 on substrate 11 provides a buried contact for device 10. An insulating layer 14 is then formed above substrate 11 and regions 12 and 13. A window (via) 15 is cut in insulating layer 14 to expose substrate 11. Then a conductive layer 16 is deposited, patterned and etched to form patterned sections 17–20 over insulating layer 14 and in via 15. Next, a dielectric layer 21 is deposited over conductive layer 16 and a via 22 is cut in layer 21 to expose a portion of conductive layer 16. Finally, a second conductive layer 23 is deposited over layer 21 and in via 22. This illustration as well as others are well-known in the prior art.

A problem encountered in this prior art technique resides in the formation of dielectric layer 21. A dielectric layer 21 such as a CVD layer, tends to follow the topology of the lower conductive layer 16. As the geometry of the device shrinks, two common undesirable qualities occur within the trench region between sections of the conductive layer 16. One undesirable quality is shown in trench 24 between conductive sections 17 and 18. A void in form of a bubble 25 forms within trench 24 entrapping air, gas or moisture. Such entrapment may result in the release of entrapped material during a subsequent critical step, but even without such release, the formation of bubble 25 greatly reduces the reliability of the device.

A second undesirable quality is shown occurring in trench 26 between conductive sections 19 and 20.

Herein open void 27 is shown in trench 26. Void 27 is open at the top, unlike the closed bubble 25. Void 27 does not entrap gaseous material, but void 27 may present an undesirable effect as conductive layer 23 is subsequently deposited.

An expanded drawing of a dotted area 28 of FIG. 1 showing trench 26 is depicted in FIG. 2. As conductive layer 23 is deposited, patterned and etched, a "forbidden gap" (term well-known in the industry) 29 forms in the void 27. The gap 29 is a remnant of the conductive layer 23 which did not completely etch away due to the steep profile of void 27. The gap 29 connects conductive sections 30 and 31 when in actuality a complete separation of sections 30 and 31 is desired. Therefore, in a typical prior art process, two of the more serious qualities, voids and forbidden gaps, cause reliability failures and result in lower manufacturing yields. The problem is more pronounced as denser packaging is used wherein the trenches between conductive sections become narrower and is especially pronounced where the trench distance 30 decreases to under 2 microns.

Figure 3:
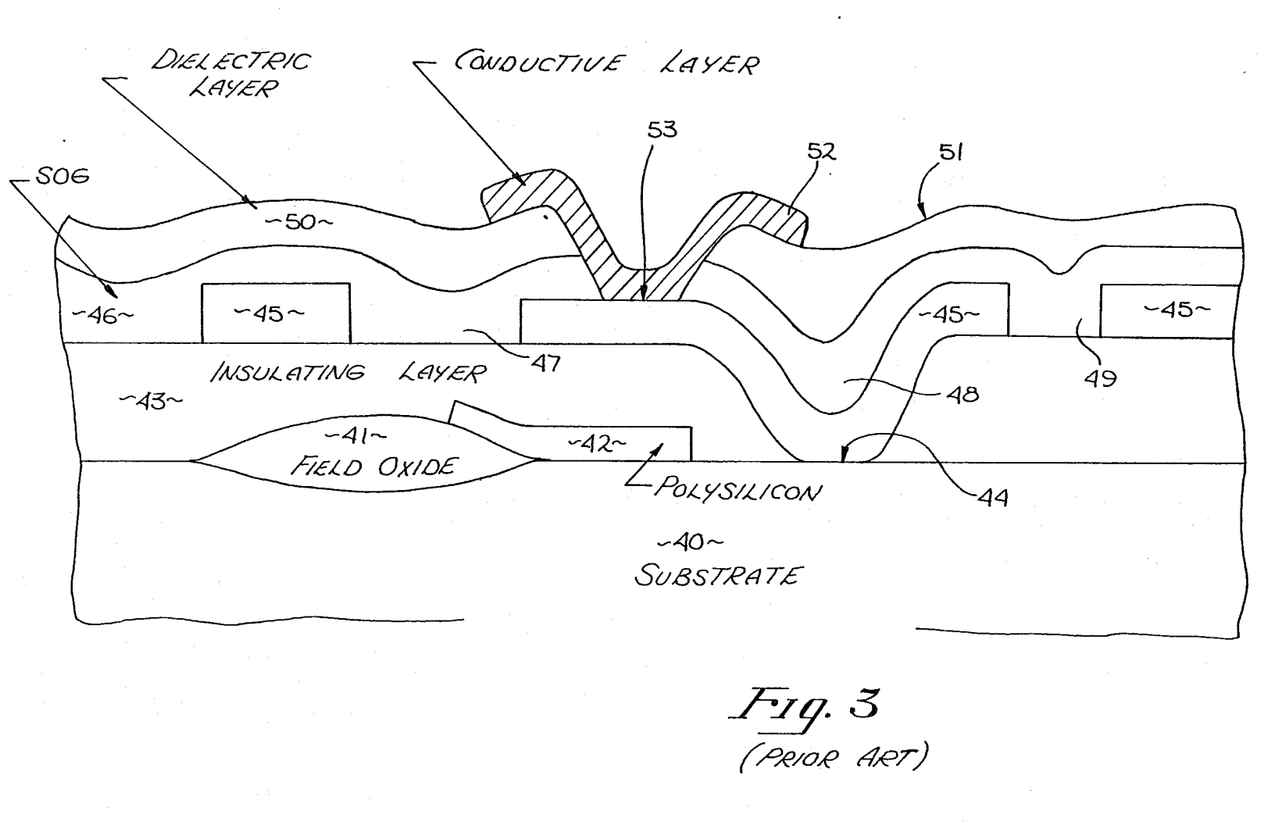
FIG. 3 is a cross-sectional elevation view of a prior art semiconductor body showing one prior art method of achieving planarization by use of a glass layer.

One method in overcoming the formation of voids and forbidden gaps is to smooth or planarize the surface topology prior to depositing a second conductive layer. In FIG. 3, one prior art method of planarizing the surface prior to depositing a second conductive layer is shown. A substrate 40 having a field oxide region 41 and a buried contact 42 underlying insulating layer 43 is shown. These formations, as well as the cutting of a via 44 and patterning of subsequently depositing a conductive layer 45, are equivalent to the procedures of forming a patterned conductive layer in FIG. 2.

Next, a spin-on-glass (SOG) layer 46 is deposited above the lower layers. The liquid property of the SOG causes SOG layer 46 to fill in trenches 47, 48 and 49 between the conductive layer segments. The SOG layer 46 prevents the formation of bubbles and steep voids. A deposition of dielectric layer 50 above SOG layer 46 results in a fairly smooth surface 51 or subsequent second conductive layer 52 formation. Deposition of dielectric layer 50 is necessary because none of the SOG on the market is thick enough to form a stand alone dielectric and further, conductive layer 52 must be isolated from SOG layer 46. If conductive layer 52 is deposited directly on SOG layer 46, SOG layer 46 will not provide an effective dielectric layer.

Although surface topology is fairly smooth, a significant problem emerges as a result of using SOG layer 46. When via 53 is cut to expose first conductive layer 45, SOG layer 46 is exposed in the area of via 53. The exposed SOG in via 53 will release gases from retained moisture and contaminate via 53 during deposition step of conductive layer 52. Therefore, the SOG layer 46 provides for planarization but now precludes formation of vias for providing a connection between first and second conductive layers. A desirable situation then is to fill in the trenches with SOG, yet leave the top portions of conductive layer 45 free of SOG for subsequent via cutting.

Figure 4:
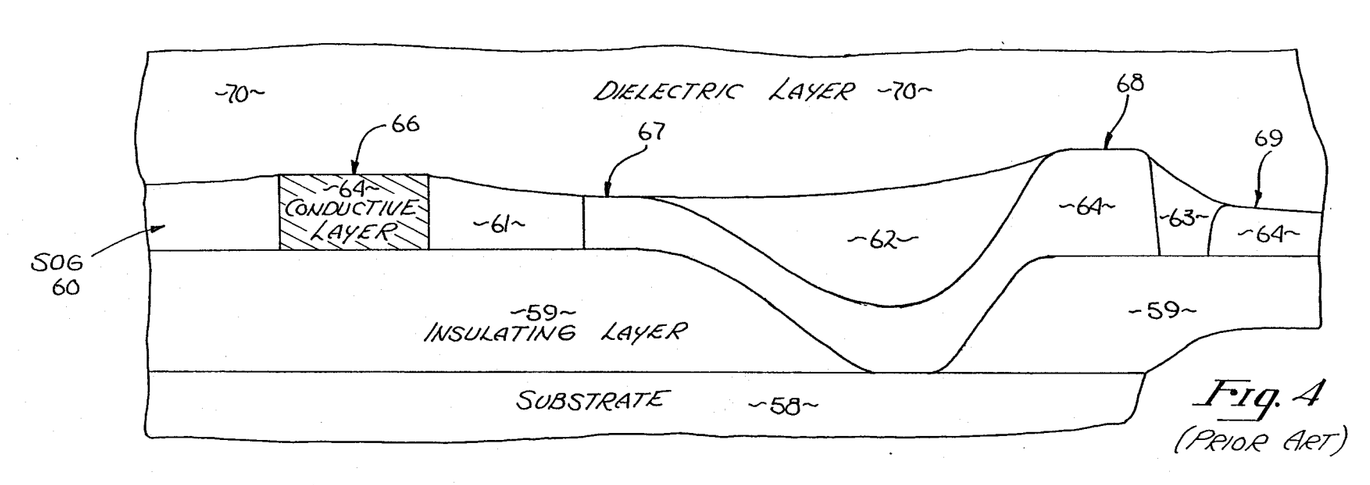
FIG. 4 is a cross-sectional elevation view of an ideal glass deposition for planarization.

FIG. 4 shows just such a desirable condition, wherein an SOG layer 60 only fills in trenches 61, 62 and 63 between sections of conductive layer 64 formed on insulating layer 59 and substrate 58. The top surfaces 66–69 of conductive layer 64 are exposed for subsequent via formation when vias are cut in dielectric layer 70. However, such an ideal condition is not readily achieved through SOG deposition or etching mostly for the following reason.

Figure 5:
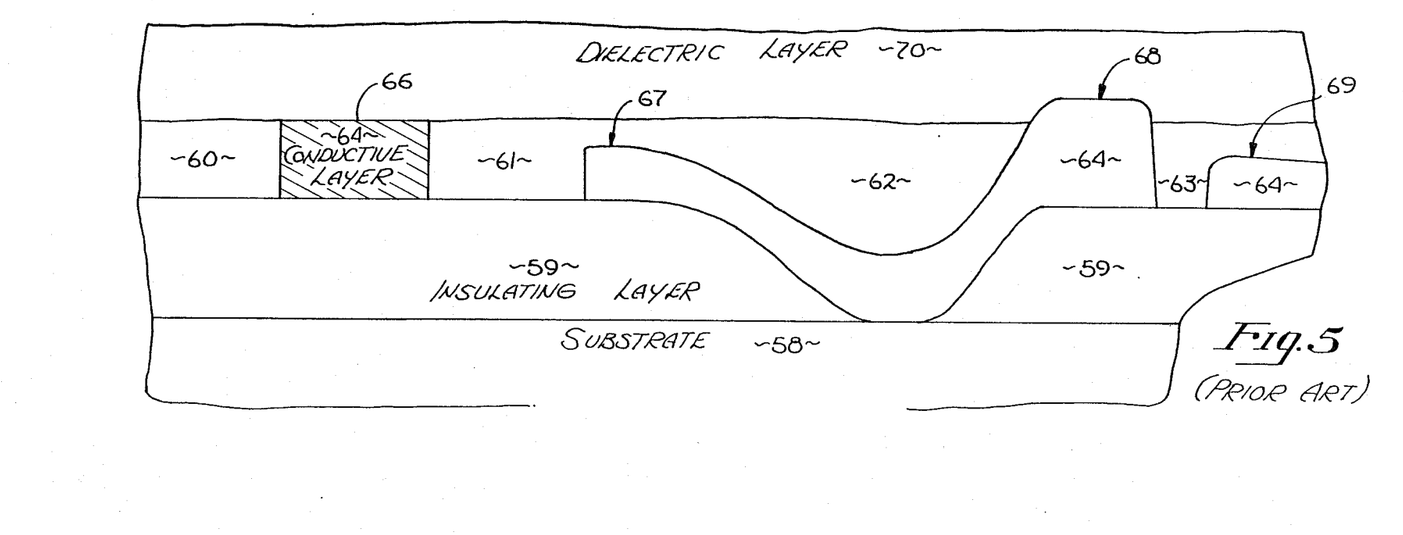
FIG. 5 is a cross-sectional elevation view showing one problem encountered in a prior art glass deposition when conductive layer thickness is non-uniform.
Figure 6:
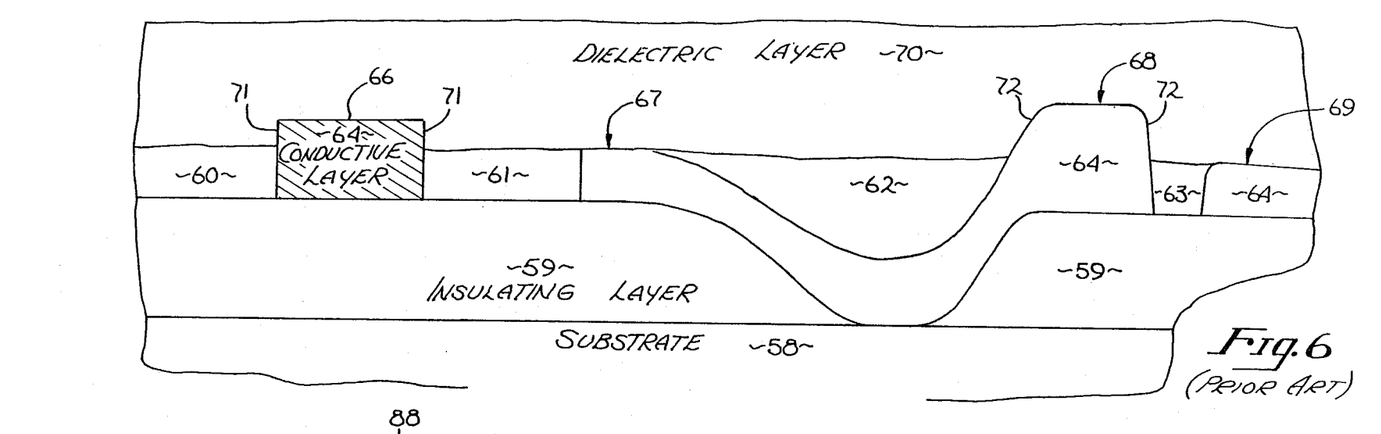
FIG. 6 is a cross-sectional elevation view showing another problem encountered in a prior art glass deposition when conductive layer thickness is non-uniform.

In semiconductor fabrication, patterning of underlying layers resulted in severe topography. Therefore, portions of conductive layer 64 will be at different elevations as shown by top surfaces 66–69 in FIG. 4. Referring to FIGS. 5 and 6, these figures represent deposition and etching in different SOG thicknesses of the semiconductor of FIG. 4. In FIG. 5, the SOG is formed to expose top surface 66. However, the proper exposure of surface 66 causes surface 68 to be overexposed and surfaces 67 and 69 not to be exposed at all. In FIG. 6, surfaces 67 and 69 are properly exposed but surfaces 66 and 68 are overexposed such that side-walls 71 and 72 are exposed above SOG layer 60. Therefore, a simple SOG deposition, as well as etching, will not produce the ideal result of filling in all of the trenches shown in FIG. 4.

PRESENT INVENTION

FIGS. 7–10 illustrate the process of the present invention for overcoming the problems encountered in the prior art. The present invention allows for variable thickness of conductive sections and high density packaging of the device. The present invention has been demonstrated to conductive heights of up to 1.1 microns and trench spacings of less than 2 microns between conductor segments. Planarized dielectric over such large conductor thickness and such small trench spacings have not been achieved effectively by prior art techniques.

Figure 7:
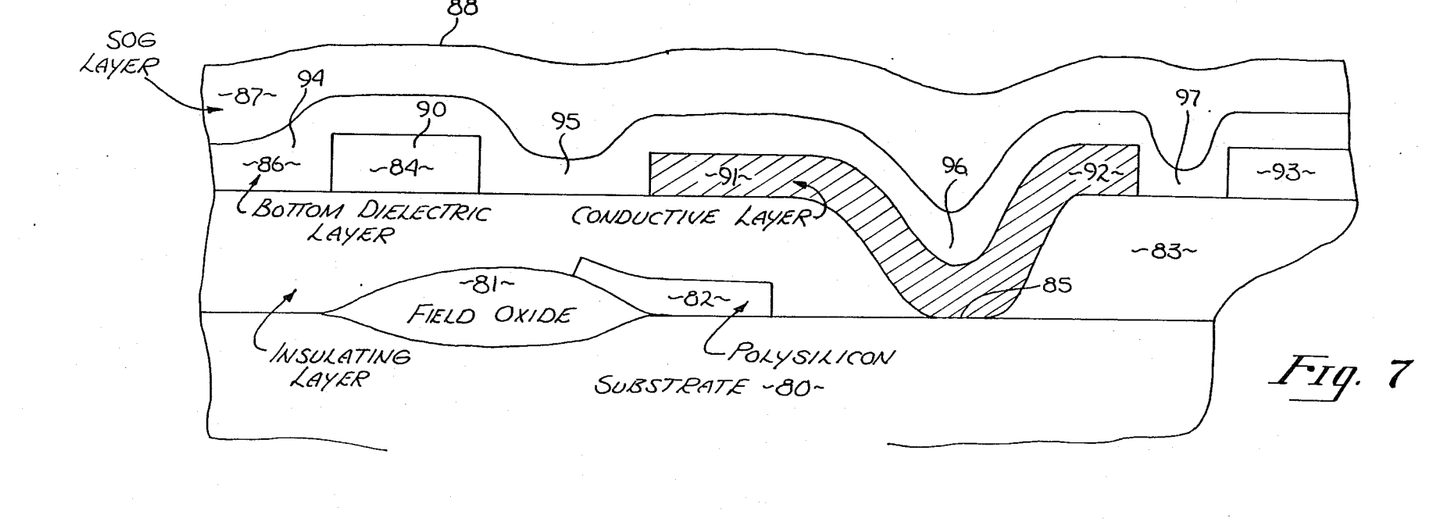
FIG. 7 is a cross-sectional elevation view showing base layers of the present invention including a bottom dielectric layer and a glass layer formed above a first conductive layer.

Referring to FIG. 7, a field oxide region 81 and buried contact 82 are formed on substrate 80. An insulating layer 83 is formed above substrate 80 and regions 81 and 82. A via 85 is next cut in layer 83 to expose substrate 80. Subsequently, a first conductive layer 84 is deposited, patterned and etched over layer 83 and in via 85. Up to this point, the steps are similar to the earlier prior art discussion in regard to these layers 80–84. Any of the well-known prior art processes may be used to provide foundation layers below the first conductive layer 84 and the structure is not limited to the description of the drawing.

It is appreciated that subsequent steps provide an improvement over the prior art. Still referring to FIG. 7, a bottom dielectric layer 86 is deposited above the lower layers 80–84 such that all conductive layer sections 90–93 are covered and trenches 94–97 are filled by dielectric layer 86. The dielectric layer 86 performs as an initial filler and also cushions SOG layer 87 which is next deposited. The preferred embodiment uses a chemical vapor deposition (CVD), more specifically a plasma silicon oxynitride deposition, at approximately 350–450 degrees C. to a thickness of approximately 8,000–10,000 A. The plasma oxynitride of the preferred embodiment has a refractive index of approximately 1.73–1.83. Although the preferred embodiment uses a plasma enhanced CVD deposited oxynitride, many dielectric materials may be used, such as low pressure and low temperature CVD oxides.

The SOG of layer 87 flows into trenches 94–97 and provides a smooth top surface 88. In the preferred embodiment, SOG is from a 108 family of Acuglass ™, manufactured by Allied Corporation. The SOG is deposited by a double-spin technique which has a baking step of approximately 190–220 degrees C. between the two spin phases. The baking is done in a in-line technique using ambient air, although other neutral gases such as nitrogen may also be used. The thickness of the SOG layer 87 will depend on the topology of the underlying layers.

Figure 8:
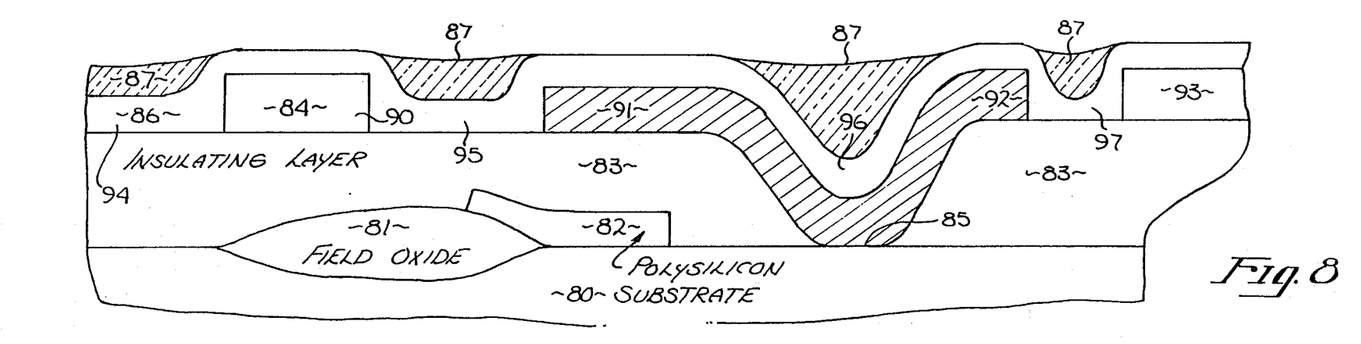
FIG. 8 is a cross-sectional elevation view showing the etch-back procedure of the present invention wherein the bottom dielectric and glass layers are etched back.

After the deposition of layers 86 and 87, both layers are etched in an etch-back process as shown in FIG. 8. The critical element of the present invention resides in this etch-back technique. The etching must proceed so that SOG layer 87 fills in the trenches 94–97 but only the bottom CVD layer 86 left is above conductive layer sections 90–93. To maintain the planarization of surface 88, the etch rate of SOG layer 87 and bottom CVD layer 86 must be approximately equal. The preferred embodiment uses sulphur hexafluoride (SF6) as an etchant in the etch-back process and etches back approximately 5,000–7,000 A.

Figure 9:
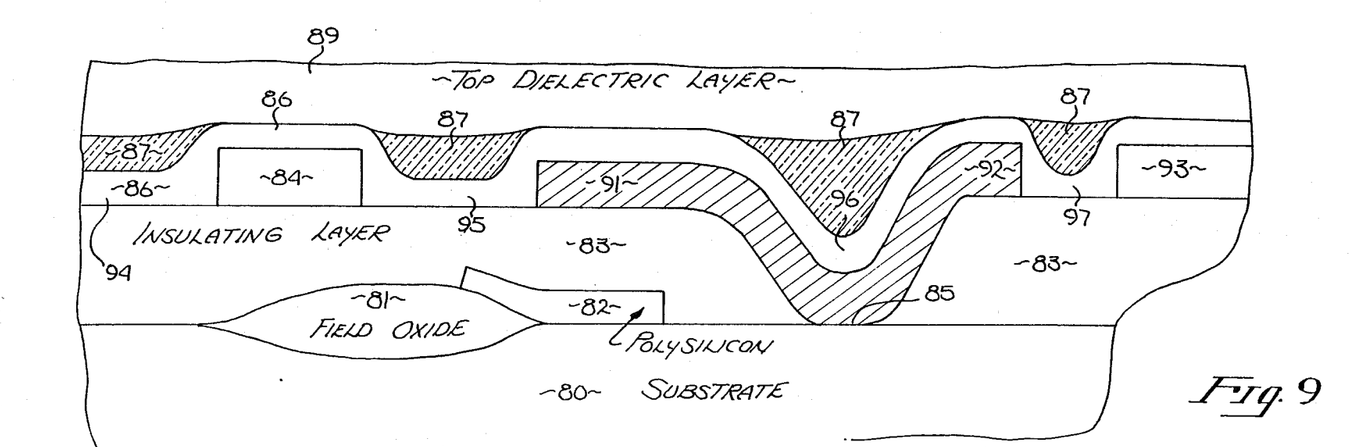
FIG. 9 is a cross-sectional elevation view showing the deposition of a top dielectric layer.

FIG. 9 illustrates the next step of depositing a top dielectric layer 89 above layers 86 and 87 to insulate subsequent layers from SOG layer 87. In the preferred embodiment, an undoped low temperature silicon oxide glass is deposited by CVD at temperatures of approximately 400–420 degrees C. to a thickness of approximately 7,000–10,000 A.

Figure 10:
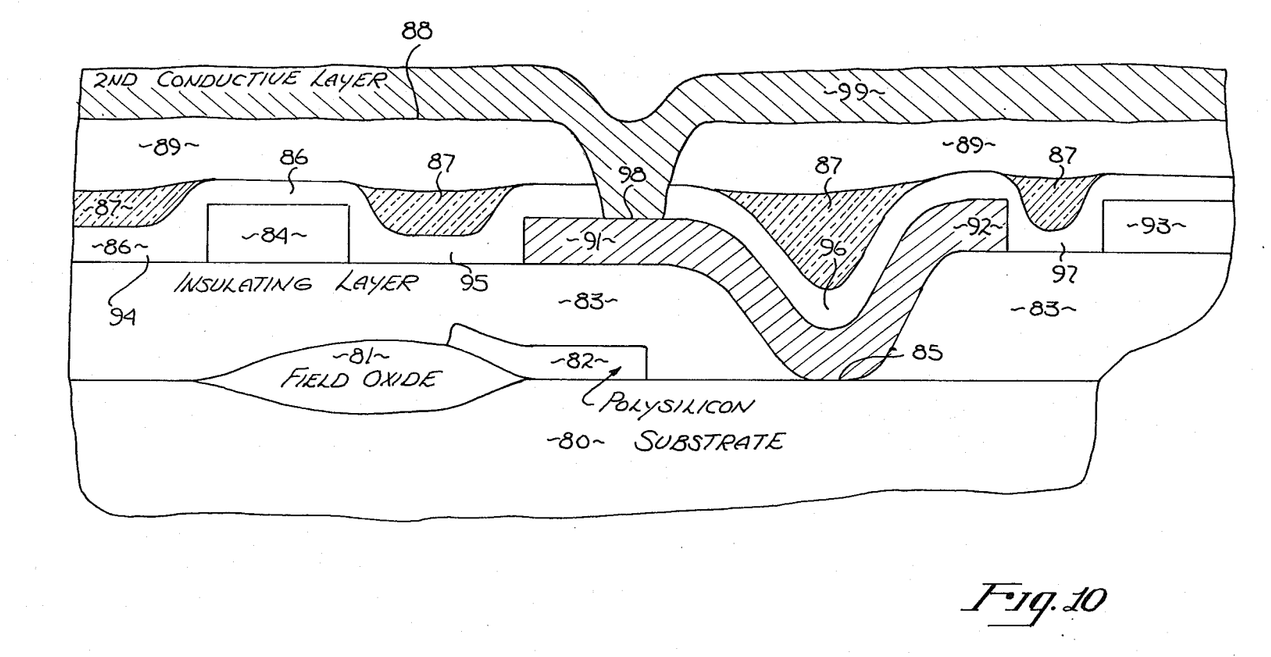
FIG. 10 is a cross-sectional elevation view showing the deposition of a second conductive layer upon a planarized surface.

Referring to FIG. 10, a via 98 is cut in top and bottom dielectric layers 86 and 89 to expose first conductive layer section 91. A second conductive layer 99 is then deposited above layer 89 and in via 98 making contact to section 91. Note that a planarized surface 88 is achieved, yet the SOG does not make physical contact with via 98 or conductive layer 99. By using the processing steps of the present invention, significant variations in conductive layer thickness may occur along with narrow trench spacings, yet maintain planarization.

Although the present invention describes a preferred embodiment using specific materials and parameters, such may be varied within the spirit and scope of the invention. Also, most prior art semiconductor foundations may be utilized and the present invention is not limited to the actual layers specified. One improvement of the invention resides in the etch-back of a glass and bottom dielectric layer to achieve planarization. Further, the process may be employed for subsequent conductive layer deposition and is not limited to a double metal process as is expounded in the preferred embodiment.

Thus, a novel method for providing planarization in a multiple conductive layer semiconductor device by using an etch-back process on a dielectric layer and a glass layer is described.

We claim:

1. The process for forming multiple layers on a semiconductor body comprising the steps of:
    depositing a first conductive layer on said semiconductor body;
    forming said first conductive layer such that openings are formed between patterned sections of said first conductive layer;
    depositing a first dielectric layer on said first conductive layer;
    depositing a glass layer on said first dielectric layer;
    etching into said first dielectric layer and said glass layer such that both layers etch back in an approximately equal rate;
    depositing a second dielectric layer on said first dielectric layer and said glass layer;
    whereby smooth planarized surface is achieved for deposition of subsequent layers.

2. The process as defined by claim 1, wherein said first dielectric, layer has a refractive index between 1.73–1.83.

3. The process as defined by claim 2, wherein said first dielectric layer is deposited by a chemical vapor deposition (CVD) technique.

4. The process as defined by claim 3, wherein said glass layer is a spin-on-glass (SOG) and deposited by a double-spin technique.

5. The process as defined by claim 4, wherein said etching is achieved by using sulphur hexafluoride.

6. The process as defined by claim 5, wherein said second dielectric layer is an undoped low temperature oxide deposited by said CVD technique.

7. The process as defined by claim 6, wherein said first conductive layer having a thickness of up to 1.1 microns.

8. The process as defined by claim 7, further including the steps of cutting a window in both of said dielectric, layers to expose said first conductive layer and depositing a second conductive layer in said window.

9. The process as defined by claim 8, wherein said semiconductor body further including a silicon substrate.

10. The process as defined by claim 9, wherein both of said conductive layers are comprised of metal layers.

11. A process for forming multiple conductive layers on a semiconductor body comprising the steps of;
    depositing a first conductive layer on said semiconductor body;
    forming said first conductive layer such that openings are formed between patterned sections of said first conductive layer;
    depositing a first oxide layer on said first conductive layer and filling said openings;
    depositing a spin-on-glass (SOG) layer on said first oxide layer;
    etching said first oxide and said SOG layers, wherein both said layers etch-back at an approximately equal rate such that said first oxide and SOG layers fill said openings between said patterned sections and said first oxide layer lies above a raised portion of said patterned sections;
    depositing a second oxide layer on said etch-back layers;
    cutting a window in said first and second oxide layers to expose said raised portions of said patterned sections;
    depositing a second conductive layer in said window; whereby a smooth planarized surface is achieved between said two conductive layers.

12. The process as defined by claim 11, wherein said first oxide layer is deposited by a chemical vapor deposition CVD technique, said first oxide layer having a refractive index of approximately 1.73–1.83 in a first thickness of approximately 8,000–10,000 A.

13. The process as defined by claim 12, wherein said SOG layer is deposited by a double-spin technique having a baking step between spins of said double-spin technique.

14. The process as defined by claim 13, wherein said etch-back of said first oxide and SOG layers is approximately 5,000–7,000 A.

15. The process as defined by claim 14, wherein said second oxide layer is deposited by said CVD technique and having a second thickness of approximately 7,000–10,000 A.

16. The process as defined by claim 15, wherein said first conductive layer having a thickness of up to 1.1 microns.

17. The process as defined by claim 16, wherein said openings between said patterned sections of said first conductive layer being less than 2 microns.

18. The process as defined by claim 17, wherein said first oxide layer is a plasma silicon oxynitride deposited by a plasma enhanced CVD technique at a temperature of approximately 350–450 degrees C.

19. The process as defined by claim 18, wherein said etching is achieved by a sulphur hexafluoride based etch.

20. The process as defined by claim 19, wherein said second oxide layer is a low temperature silicon oxide glass deposited in a temperature of approximately 400–420 degrees C.

21. The process as defined by claim 20, wherein said SOG layer is baked in an air ambient in-line baking process.

22. The process as defined by claim 20, wherein said SOG layer is baked in a nitrogen in-line baking process.

23. The process as defined by claim 21 or claim 22, wherein said semiconductor body further including a silicon substrate.

24. The process as defined by claim 23, wherein said conductive layers are comprised of metal layers.

25. The process as defined by claim 20, wherein said window is formed by a two step etch process using a wet etchant and a dry anistropic oxide etch.

26. A process for forming a complementary metal-oxide semiconductor (CMOS) double metal device, comprising the steps of:
   depositing a first metal layer on said semiconductor body;
   forming said first metal layer such that openings are formed between patterned sections of said first metal layer;
   utilizing a chemical vapor deposition (CVD) technique to deposit a first oxide layer having a first thickness of approximately 9,000 A and a refractive index of approximately 1.79 on said first metal layer;
   depositing a spin-on glass (SOG) layer on said first oxide layer, said SOG layer deposited by a double-spin technique having a baking step between spins of said double-spin technique and having a baking temperature of approximately 200 degrees C.;
   etching back said first oxide and SOG layers where both said layers etch-back at an approximately equal rate such that said first oxide and SOG layers fill said openings between said patterned sections and said first oxide layer lies above a raised portion of said patterned sections;
   cutting a window in said first oxide layer and said SOG layer to expose said raised portions of said patterned sections;
   depositing a second metal layer in said window;
   whereby a smooth planarized surface is achieved between said two metal layers.

27. The process as defined by claim 26, wherein said semiconductor body further including a silicon substrate.

* * * * *